(12) United States Patent
Zhou et al.

(10) Patent No.: US 12,550,438 B2
(45) Date of Patent: Feb. 10, 2026

(54) DISPLAY SUBSTRATE AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Weifeng Zhou, Beijing (CN); Yuanzheng Guo, Beijing (CN); Tao Gao, Beijing (CN); Ling Shi, Beijing (CN); Yang Yang, Beijing (CN); Qingsong Wang, Beijing (CN); Liqiang Chen, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 694 days.

(21) Appl. No.: 17/922,151

(22) PCT Filed: Oct. 12, 2021

(86) PCT No.: PCT/CN2021/123184
§ 371 (c)(1),
(2) Date: Oct. 28, 2022

(87) PCT Pub. No.: WO2022/095666
PCT Pub. Date: May 12, 2022

(65) Prior Publication Data
US 2023/0178567 A1   Jun. 8, 2023

(30) Foreign Application Priority Data

Nov. 3, 2020   (CN) .......................... 202011209171.7

(51) Int. Cl.
*H01L 27/12* (2006.01)
*H10D 86/40* (2025.01)
*H10D 86/60* (2025.01)

(52) U.S. Cl.
CPC ........... *H10D 86/60* (2025.01); *H10D 86/411* (2025.01); *H10D 86/443* (2025.01)

(58) Field of Classification Search
None
See application file for complete search history.

(56) References Cited

U.S. PATENT DOCUMENTS

| 2018/0053905 A1* | 2/2018 | Lee | ...................... H10K 59/126 |
| 2020/0266367 A1 | 8/2020 | Wang et al. | |
| 2022/0336525 A1 | 10/2022 | Li | |

FOREIGN PATENT DOCUMENTS

| CN | 106972030 A1 | 7/2017 |
| CN | 107768405 A | 3/2018 |

(Continued)

*Primary Examiner* — William C Trapanese
(74) *Attorney, Agent, or Firm* — Raj S. Dave; Dave Law Group LLC

(57) ABSTRACT

The display substrate comprises: a flexible substrate having a display area and a peripheral area located on at least one side of the display area, wherein the peripheral area sequentially comprises a wiring area, a bending area and a pad area along a direction away from the display area; a first electrical structure on a side of the bending area away from the pad area; a second electrical structure located in the pad area; wherein the flexible substrate comprises: a first flexible substrate; a second flexible substrate and a wiring, wherein the wiring have a first portion in the wiring area, a second portion in the bending area, and a third portion in the pad area, wherein the first electrical structure is connected to the first portion, and the second electrical structure is connected to the third portion.

19 Claims, 6 Drawing Sheets

(56) References Cited

FOREIGN PATENT DOCUMENTS

| | | |
|---|---|---|
| CN | 108597378 A | 9/2018 |
| CN | 109148541 A | 1/2019 |
| CN | 109860253 A | 6/2019 |
| CN | 111710691 A | 9/2020 |
| CN | 112331677 A | 2/2021 |

* cited by examiner

DISPLAY SUBSTRATE AND DISPLAY APPARATUS

CROSS-REFERENCE TO RELATED APPLICATION

This application is a National Stage Entry of PCT/CN2021/123184 filed on Oct. 12, 2021, which claims the priority of Chinese patent application No. 202011209171.7 filed on Nov. 3, 2020. The contents disclosed in the above Chinese patent application are hereby cited in their entirety as a part of this application.

TECHNICAL FIELD

Embodiments of the present disclosure relate to the field of display technology, and in particular, to a display substrate and a display apparatus.

BACKGROUND

Flexible displays are widely used in smart terminal products such as mobile phones and tablet computers.

SUMMARY

Embodiments of the present disclosure provide a display substrate and a display apparatus, which can reduce a thickness of the display substrate and a width of a lower frame of the display substrate.

In a first aspect of the present disclosure, a display substrate is provided. The display substrate comprises: a flexible substrate having a display area and a peripheral area located on at least one side of the display area, wherein the peripheral area sequentially comprises a wiring area, a bending area and a pad area along a direction away from the display area; a first electrical structure located on a side of the bending area of the flexible substrate away from the pad area; a second electrical structure located in the pad area; wherein the flexible substrate comprises: a first flexible substrate; a second flexible substrate located on the first flexible substrate; and a wiring located between the first flexible substrate and the second flexible substrate, wherein the wiring has a first portion located in the wiring area, a second portion located in the bending area, and a third portion located in the pad area, wherein the first electrical structure is connected to the first portion of the wiring and the second electrical structure is connected to the third portion of the wiring.

In an embodiment of the present disclosure, the display substrate further comprises: a thin film transistor located in the display area, the thin film transistor comprising an active layer on the flexible substrate, a gate insulating layer on the active layer, and a gate electrode located on the gate insulating layer, wherein the gate insulating layer is a part of a first insulating layer covering the flexible substrate, the first insulating layer has a first portion located in the display area and the wiring area, and the gate electrode is a part of a first conductive layer located on the first insulating layer; wherein the first conductive layer comprises the first electrical structure.

In an embodiment of the present disclosure, the first insulating layer has a first side facing the flexible substrate, a second side facing away from the flexible substrate, and a third side of a first portion of the first insulating layer connecting the first side and the second side and adjacent to the bending area, the first electrical structure further comprises a first portion covering the second side of the first portion of the first insulating layer and a second portion covering the third side, wherein the first electrical structure contacts the first portion of the wiring via a first opening of the second flexible substrate.

In an embodiment of the present disclosure, the display substrate further comprises: a thin film transistor located in the display area, the thin film transistor comprising an active layer located on the flexible substrate, a gate insulating layer located on the active layer, and a gate electrode on the gate insulating layer, wherein the gate insulating layer is a part of a first insulating layer covering the flexible substrate, the first insulating layer has a first portion located in the display area and the wiring area, and the gate electrode is a part of the first conductive layer located on the first insulating layer; a second insulating layer, comprising a first portion located on the first conductive layer and on the first portion of the first insulating layer in the display area and the wiring area; a second conductive layer located on the second insulating layer; wherein at least one of the first conductive layer and the second conductive layer comprises the first electrical structure.

In an embodiment of the present disclosure, the second conductive layer comprises the first electrical structure, and the second insulating layer has a first side facing the flexible substrate, a second side facing away from the flexible substrate, and a third side of a first portion of the second insulating layer connecting the first side and the second side and adjacent to the bending area, the first electrical structure further comprises a first portion covering the second side of the first portion of the second insulating layer and a second portion covering the third side, wherein the first electrical structure contacts the first portion of the wiring via a first opening of the second flexible substrate.

In an embodiment of the present disclosure, the display substrate further comprises: a thin film transistor located in the display area, the thin film transistor comprising an active layer located on the flexible substrate, a gate insulating layer located on the active layer, and a gate electrode located on the gate insulating layer, wherein the gate insulating layer is a part of a first insulating layer covering the flexible substrate, the first insulating layer has a first portion located in the display area and the wiring area, and the gate electrode is a part of the first conductive layer located on the first insulating layer; a second insulating layer, comprising a first portion located on the first conductive layer and on the first portion of the first insulating layer in the display area and the wiring area; a second conductive layer located on the second insulating layer; a third insulating layer, comprising a first portion located on the second conductive layer and on a first portion of the second insulating layer in the display area and the wiring area; a third conductive layer located on the third insulating layer, wherein the third conductive layer comprises a source/drain electrode of the thin film transistor, and the source/drain electrode is connected to a source/drain region of the active layer of the thin film transistor via a hole passing through the first insulating layer, the second insulating layer and the third insulating layer; wherein at least one of the first conductive layer, the second conductive layer and the third conductive layer comprises the first electrical structure.

In an embodiment of the present disclosure, the third conductive layer comprises the first electrical structure, and the third insulating layer has a first side facing the flexible substrate, a second side facing away from the flexible substrate, and a third side of a first portion of the third insulating layer connecting the first side and the second side and adjacent to the bending area, the first electrical structure further comprises a first portion covering the second side of the first portion of the third insulating layer and a second portion covering the third side, wherein the first electrical structure contacts the first portion of the wiring via a first opening of the second flexible substrate.

In an embodiment of the present disclosure, the display substrate further comprises: a thin film transistor located in the display area, the thin film transistor comprising an active layer located on the flexible substrate, a gate insulating layer located on the active layer, and a gate electrode located on the gate insulating layer, wherein the gate insulating layer is a part of a first insulating layer covering the flexible substrate, the first insulating layer has a first portion located in the display area and the wiring area, and the gate electrode is a part of the first conductive layer located on the first insulating layer; a second insulating layer, comprising a first portion located on the first conductive layer and on the first portion of the first insulating layer in the display area and the wiring area; a second conductive layer located on the second insulating layer; a third insulating layer, comprising a first portion located on the second conductive layer and on a first portion of the second insulating layer in the display area and the wiring area; a third conductive layer located on the third insulating layer, wherein the third conductive layer comprises a source/drain electrode of the thin film transistor, and the source/drain electrode is connected to a source/drain region of the active layer of the thin film transistor via a hole passing through the first insulating layer, the second insulating layer and the third insulating layer; a fourth insulating layer comprising a first portion on the first portion of the third insulating layer in the display area and the wiring area; and a fourth conductive layer located on the fourth insulating layer; wherein at least one of the first conductive layer, the second conductive layer, the third conductive layer and the fourth conductive layer comprises the first electrical structure.

In an embodiment of the present disclosure, the fourth conductive layer comprises the first electrical structure, and the fourth insulating layer has a first side facing the flexible substrate, a second side facing away from the flexible substrate, and a third side of a first portion of the fourth insulating layer connecting the first side and the second side and adjacent to the bending area, the first electrical structure further comprises a first portion covering the second side of the first portion of the fourth insulating layer and a second portion covering the third side, wherein the first electrical structure contacts the first portion of the wiring via a first opening of the second flexible substrate.

In an embodiment of the present disclosure, the first conductive layer comprises the first electrical structure, the display substrate further comprises a third electrical structure on the third insulating layer, the third electrical structure is connected to the first electrical structure via a hole passing through the third insulating layer.

In an embodiment of the present disclosure, the second conductive layer comprises the first electrical structure, the display substrate further comprises a third electrical structure on the third insulating layer, the third electrical structure is connected to the first electrical structure via a hole passing through the third insulating layer.

In an embodiment of the present disclosure, at least one of the third conductive layer and the fourth conductive layer comprises the third electrical structure.

In an embodiment of the present disclosure, the first insulating layer further comprises a second portion located in the pad area, the second insulating layer further comprises a second portion located on the second portion of the first insulating layer in the pad area; the third insulating layer further comprises a second portion located on the second portion of the second insulating layer in the pad area; the fourth insulating layer further comprises a second portion located on the second portion of the third insulating layer in the pad area; and wherein, at least one of the first conductive layer, the second conductive layer, the third conductive layer and the fourth conductive layer further comprises a second electrical structure, and the second electrical structure is connected to the third portion of the wiring via a second opening of the second flexible substrate.

In an embodiment of the present disclosure, the wiring comprise a first wiring, a second wiring, a third wiring and a fourth wiring spaced apart in a direction perpendicular to a direction from the display area to the pad area, the first electrical structure comprises a first electrical sub-structure, a second electrical sub-structure, a third electrical sub-structure and a fourth electrical sub-structure, the second electrical structure comprises a fifth electrical sub-structure, a six electrical sub-structure, a seventh electrical sub-structure and a eighth electrical sub-structure; wherein the first conductive layer comprises the first electrical sub-structure and the fifth electrical sub-structure; the second conductive layer comprises the second electrical sub-structure and the sixth electrical sub-structure; the third conductive layer comprises the third electrical sub-structure and the seventh electrical sub-structure; and the fourth conductive layer comprises the fourth electrical sub-structure and the eighth electrical sub-structure.

In an embodiment of the present disclosure, the first portion of the wiring extends to the display area in a direction from the pad area to the display area, the flexible substrate further comprises an insulating layer between the first flexible substrate and the second flexible substrate, wherein the insulating layer comprises a first portion in the display area and the wiring area and a second portion in the pad area, at least a part of the first portion of the wiring is located between the first portion of the insulating layer and the second flexible substrate, at least a part of the third portion of the wiring is located between the second portion of the insulating layer and the second flexible substrate.

In an embodiment of the present disclosure, the first portion of the wiring comprises a first sub-portion located between the first portion of the insulating layer and the second flexible substrate, a second sub-portion located between the first portion of the insulating layer and the first flexible substrate, and a third sub-portion connecting the first sub-portion and the second sub-portion, wherein the third portion of the wiring comprises a first sub-portion located between the second portion of the insulating layer and the second flexible substrate, a second sub-portion located between the second portion of the insulating layer and the first flexible substrate, and a third sub-portion connecting the first sub-portion and the second sub-portion.

In an embodiment of the present disclosure, the second conductive layer comprising the first electrical structure, the first electrical structure is connected to the first portion of the wiring via a hole passing through the first insulating layer, the second insulating layer and the second flexible substrate.

In a second aspect of the present disclosure, a display apparatus is provided. The display apparatus comprises any one of the display substrate described in the first aspect of the present disclosure.

Further aspects and scopes of applicability will become apparent from the description provided herein. It should be understood that various aspects of the present application may be implemented individually or in combination with one or more other aspects. It should also be understood that the description and specific examples herein are intended for purposes of illustration only and are not intended to limit the scope of the present application.

BRIEF DESCRIPTION OF THE DRAWINGS

The drawings described herein are for illustrative purposes only of the selected embodiments and not all possible implementations, and are not intended to limit the scope of the present application. In the drawings.

DETAILED DESCRIPTION

Figure 1A:
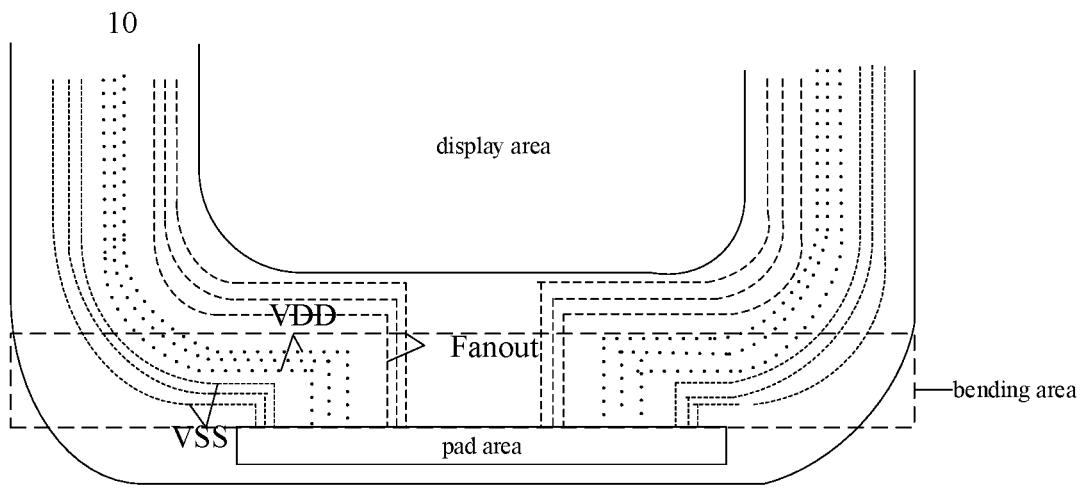
FIG. 1A shows a schematic diagram of a flexible display substrate.

Various embodiments will now be described in detail with reference to the accompanying drawings, which are provided as illustrative examples of the present disclosure to enable those skilled in the art to practice the present disclosure.

Notably, the following figures and examples are not meant to limit the scope of the present disclosure. Where a particular element of the present disclosure may be implemented, in part or in whole, using known components (or methods or processes), only those parts of such known components (or methods or processes) that are necessary for understanding the present disclosure will be described, and detailed descriptions of other parts of such known components will be omitted so as not to obscure the present disclosure. Further, the various embodiments contain, by way of illustration, present and future known equivalents to the components referred to herein.

In the description of the present disclosure, the orientation or positional relationship indicated by the terms "up", "over", "down", "under", "between", etc. is based on the orientation or positional relationship shown in the drawings. It is only for the convenience of describing the present disclosure and to simplify the description, rather than indicating or implying that the referred device or element must have a particular orientation, be constructed and operate in a particular orientation, and therefore should not be construed as limiting the disclosure. In addition, when an element or layer is referred to as being "on" another element or layer, it can be directly on the other element or layer, or intervening elements or layers may be present. Likewise, when an element or layer is referred to as being "under" another element or layer, it can be directly under the other element or layer, or at least one intervening element or layer may be present. When an element or layer is referred to as being "between" two elements or layers, it may be the only element or layer between the two elements or layers, or more than one intervening element or layer may be present.

As used herein and in the appended claims, the singular forms of words include the plural and vice versa unless the context clearly dictates otherwise. Thus, when referring to the singular, the plural of the corresponding term is generally included. Similarly, the terms "comprising", "including", "containing" and "having" and their grammatical variants are intended to be inclusive and mean that there may be additional elements other than the listed elements. Where the term "example" is used herein, particularly when it follows a group of terms, the "example" is merely exemplary and illustrative and should not be considered exclusive or broad. The terms "first", "second", "third", etc. are used for descriptive purposes only and should not be construed to indicate or imply relative importance and order of formation.

FIG. 1A shows a schematic diagram of a flexible display substrate 10. As shown in FIG. 1A, the lower frame of the flexible display substrate 10 is provided with power signal lines (VSS, VDD) and fanout lines (Fanout) of the data signal lines, which causes the problem that the width of the lower frame of the flexible display substrate 10 is relatively large, which is not conducive to realizing the design of narrow frame. In the related art, the lower frame of the flexible display substrate is often bent to reduce the width of the lower frame.

Figure 1B:
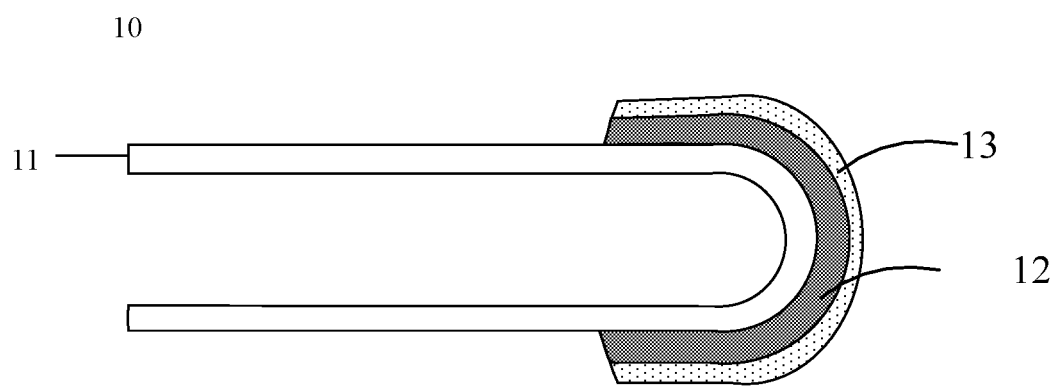
FIG. 1B shows a cross-sectional view of a flexible display substrate in a bending area.

FIG. 1B shows a cross-sectional view of the flexible display substrate 10 shown in FIG. 1A in the bending area. As shown in FIG. 1B, the flexible display substrate 10 includes a flexible base 11 and wiring 12 for connecting pixels and integrated circuit chips. Since the wiring 12 is generally not an organic material, it is resistant to compression but not to stretching. In the absence of the ultraviolet (UV) glue 13, the wiring 12 is in a stretched state when it is bent, and thus is prone to breakage. In material mechanics, when a structure A with a multi-layer structure undergoes bending deformation, some layers undergo elongation deformation, and other layers undergo compressive deformation. At the junction of the elongation layer and the compression layer, the layer that neither undergo elongation deformation nor undergo compressive deformation is called the neutral layer of the structure A. By coating a layer of UV glue 13 on the wiring 12, the position of the neutral layer can be adjusted so that the bent wiring 12 is in a compressed state instead of a stretched state, thereby avoiding the problem of the wiring 12 being broken. However, the additional UV glue 13 will result in an increase in the thickness of the flexible display substrate 10 in the bending area.

Figure 2A:
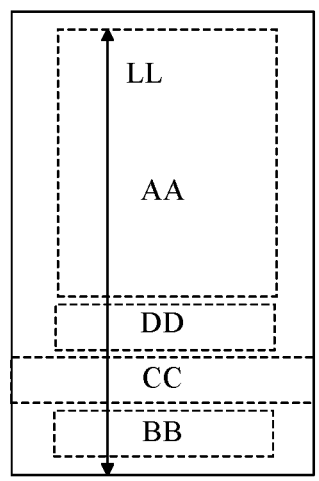
FIG. 2A shows a schematic diagram of a display substrate according to an embodiment of the present disclosure.
Figure 2B:
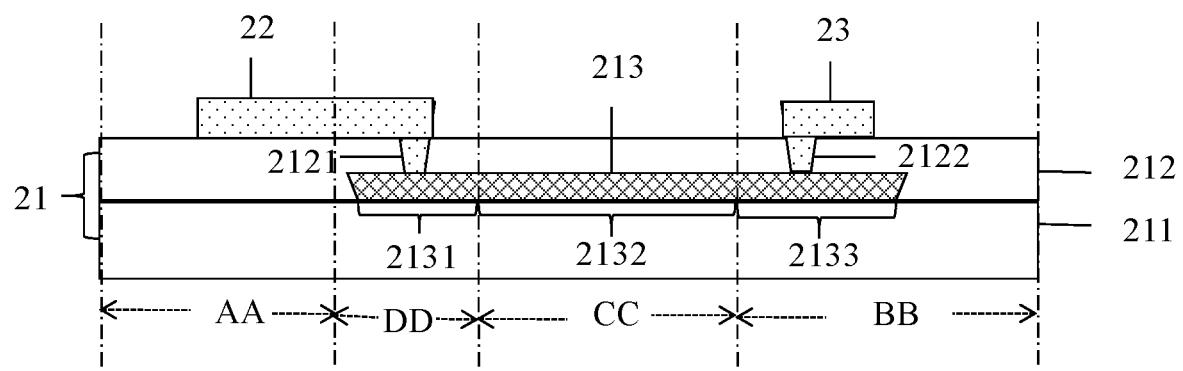
FIG. 2B shows a cross-sectional view of a display substrate according to an embodiment of the present disclosure.

FIG. 2A shows a schematic diagram of a display substrate according to an embodiment of the present disclosure, and FIG. 2B shows a cross-sectional view of the display substrate shown in FIG. 2A at a line LL. As shown in FIGS. 2A and 2B, the display substrate may include a flexible substrate 21, a first electrical structure 22 and a second electrical structure 23. The flexible substrate 21 has a display area AA and a peripheral area on at least one side of the display area AA. As shown in FIG. 2A, the peripheral area sequentially includes a wiring area DD, a bending area CC and a pad area BB along a direction away from the display area AA. The flexible substrate 21 may include a first flexible substrate 211, a second flexible substrate 212 on the first flexible substrate 211, and a wiring 213 between the first flexible substrate 211 and the second flexible substrate 212. The second flexible substrate 212 may have a first opening 2121 located in the display area AA and a second opening 2122 located in the pad area BB. The wiring 213 has a first portion 2131 in the wiring area DD, a second portion 2132 in the bending area CC, and a third portion 2133 in the pad BB area. The first electrical structure 22 is located on the side of the bending area CC of the flexible substrate 21 away from the pad area BB, as shown in FIG. 2, the first electrical structure 22 is located in the wiring area DD and/or the display area AA, and is connected to the first portion 2131 of the wiring 213 via the first opening 2121. The second electrical structure 23 is located within the pad area BB of the flexible substrate 21 and is connected to the third portion 2133 of the wiring 213 via the second opening 2122.

In the embodiment of the present disclosure, the material of the first flexible substrate and the second flexible substrate may include polyimide, and the material of the wiring may include metal molybdenum, a stacked structure of Ti/Al/Ti, or other conductive materials. The first electrical structure may include data signal lines, scan signal lines, light-emitting signal lines, power supply lines, and the like. The second electrical structure may include signal lines, pads, or integrated circuit chips, among others.

Through the above-described configuration in which wirings passing through the wiring area, the bending area, and the pad area in this order are disposed between the first flexible substrate and the second flexible substrate, various wirings located in the wiring area and/or the display area can be connected to this wiring. In addition, in the bending area, since the wiring is disposed between the first flexible substrate and the second flexible substrate, the wiring is located at the neutral layer of the overall substrate composed of the first flexible substrate and the second flexible substrate layer. There is no need to additionally use UV glue, so that the increase in the thickness of the frame caused by the UV glue can be avoided. In this application, the thickness refers to the height of the surface away from the substrate from the surface close to the substrate in the direction perpendicular to the plane of the substrate.

Figure 3:
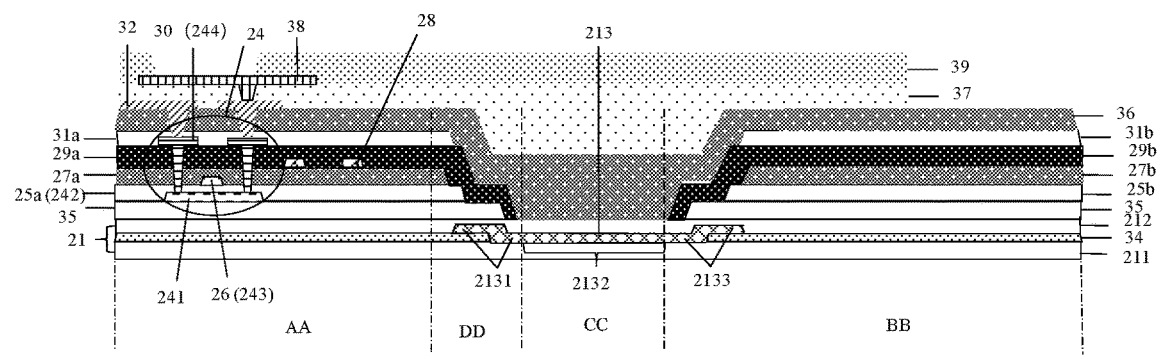
FIG. 3 illustrates a cross-sectional view of a display substrate according to an embodiment of the present disclosure.

FIG. 3 illustrates a cross-sectional view of a display substrate according to an embodiment of the present disclosure. In the present application, the cross-sectional view of the display substrate may be taken along the line LL of the display substrate shown in FIG. 2A. As shown in FIG. 3, the display substrate further includes a thin film transistor 24, a first insulating layer 25 (25a, 25b), a first conductive layer 26, a second insulating layer 27 (27a, 27b), a second conductive layer 28, a third insulating layer 29 (29a, 29b), a third conductive layer 30, a fourth insulating layer 31 (31a, 31b), and a fourth conductive layer 32.

It should be noted that, for the sake of clarity of description, the first electrical structure 22 and the second electrical structure 23 are not shown in FIG. 3. However, various configurations of the first electrical structure 22 and the second electrical structure 23 are shown in detail in FIGS. 4-7.

Continuing to refer to FIG. 3, the thin film transistor 24 is located in the display area AA and includes an active layer 241 on the flexible substrate 21, a gate insulating layer 242 on the active layer 241, and a gate electrode 243 on the gate insulating layer 242. In an embodiment of the present disclosure, the gate insulating layer 242 is part of the first insulating layer 25, the gate electrode 243 is part of the first conductive layer 26, and source/drain electrodes 244 are part of the third conductive layer 30. The source/drain electrodes 244 may be connected to source/drain regions of the active layer 241 of the thin film transistor 24 through holes passing through the first insulating layer 25, the second insulating layer 27 and the third insulating layer 29.

As shown in FIG. 3, the first insulating layer 25 may cover the flexible substrate 21 and have a first portion 25a located in the display area AA and the wiring area DD and a second portion 25b located in the pad area BB. The first conductive layer 26 may be located on the first insulating layer 25. The second insulating layer 27 may include a first portion 27a and a second portion 27b, wherein the first portion 27a is located on the first conductive layer 26 and the first portion 25a of the first insulating layer 25 in the display area AA and the wiring area DD, and the second portion 27b is located on the second portion 25b of the first insulating layer 25 in the pad area BB. The second conductive layer 28 may be on the second insulating layer 27. The third insulating layer 29 may include a first portion 29a and a second portion 29b, wherein the first portion 29a is located on the second conductive layer 28 and the first portion 27a of the second insulating layer 27 in the display area AA and the wiring area DD, and the second portion 29b is located on the second portion 27b of the second insulating layer 27 in the pad area BB. The third conductive layer 30 may be on the third insulating layer 29 and may include the source/drain electrodes 244 of the thin film transistor 24. The fourth insulating layer 31 may include a first portion 31a and a second portion 31b, wherein the first portion 31a is located on the third conductive layer 30 and the first portion 29a of the third insulating layer 29 in the display area AA and the wiring area DD, and the second portion 31b is located on the second portion 29b of the third insulating layer 29 in the pad area BB. The fourth conductive layer 32 may be located on the fourth insulating layer 31.

The display substrate shown in FIG. 3 may further include a first barrier layer 34 located between the first flexible substrate 211 and the second flexible substrate 212 (ie, as a part of the flexible substrate 21), a second barrier layer 35 located between the first insulating layer 25 and the second flexible substrate 212, a first planarization layer 36 located on the fourth insulating layer 31, and a second planarization layer 37 serving as a fifth insulating layer on the first planarization layer 36 and covering the fourth conductive layer 32, an anode layer 38 as part of the light emitting device on the second planarization layer 37, and a pixel defining layer 39 on the second planarization layer 37 and the anode layer 38. As shown in FIG. 3, the fourth conductive layer 32 may be located on the first planarization layer 36 and contact the third conductive layer 30 through a hole passing through the first planarization layer 36 and the first portion 31a of the fourth insulating layer 31. It should be understood that the display substrate shown in FIG. 3 may also include other additional film layers or structures depending on actual needs, which are not specifically limited and described herein.

In an embodiment of the present disclosure, at least one of the first conductive layer 26, the second conductive layer 28, the third conductive layer 30, and the fourth conductive layer 32 shown in FIG. 3 may include the first electrical structure 22 shown in FIG. 2.

Figure 4:
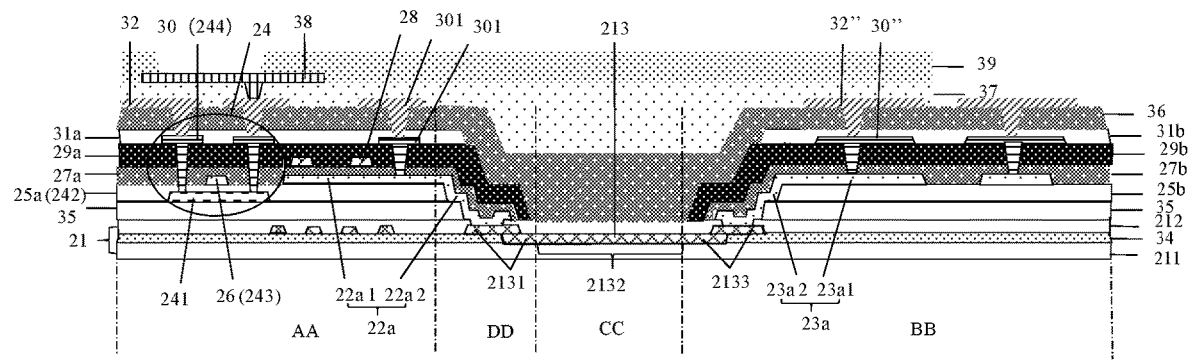
FIG. 4 illustrates a cross-sectional view of a display substrate according to an embodiment of the present disclosure.

FIG. 4 illustrates a cross-sectional view of a display substrate according to an embodiment of the present disclosure, wherein the first conductive layer 26 includes a first electrical structure 22a and a second electrical structure 23a. As shown in FIG. 4, the first insulating layer 25 has a first side facing the flexible substrate 21, a second side facing away from the flexible substrate 21, and a third side of the first portion 25a of the first insulating layer 25 connecting the first side and the second side and adjacent to the bending area CC. The first electrical structure 22a may include a first portion 22a1 and a second portion 22a2. The first portion 22a1 may cover the second side of the first portion 25a of the first insulating layer 25. The second portion 22a2 may cover the third side of the first portion 25a of the first insulating layer 25, and may contact the first portion 2131 of the wiring 213 through the first opening in the second flexible substrate 212.

As shown in FIG. 4, the second portion 25b of the first insulating layer 25 has a fourth side connecting the first and second sides of the first insulating layer 25 and adjacent to the bending area CC. The second electrical structure 23a may include a first portion 23a1 and a second portion 23a2. The first portion 23a1 may cover the second side of the second portion 25b of the first insulating layer 25. The second portion 23a2 may cover the fourth side of the second portion 25b of the first insulating layer 25 and may contact the third portion 2133 of the wiring 213 through the second opening in the second flexible substrate 212.

In the example shown in FIG. 4, the third conductive layer 30 of the display substrate further includes a third electrical structure 301 located in the display area AA and an electrical structure 30" located in the pad area BB. The third electrical structure 301 of the third conductive layer 30 may contact the first portion 22a1 of the first electrical structure 22a via the openings in the first portion 27a of the second insulating layer 27 and the first portion 29a of the third insulating layer 29. The electrical structure 30" may contact the first portion 23a1 of the second electrical structure 23a via the openings in the second portion 27b of the second insulating layer 27 and the second portion 29b of the third insulating layer 29. In addition, the fourth conductive layer 32 of the display substrate further includes a third electrical structure 301 located in the display area AA and an electrical structure 32" located in the pad area BB. The third electrical structure 301 of the fourth conductive layer 32 may contact the third electrical structure 301 of the third conductive layer 32 via the opening in the first portion 31a of the fourth insulating layer 31 and the first planarization layer 36. The electrical structure 32" may contact the electrical structure 30" via the openings in the second portion 31b of the fourth insulating layer 31 and the first planarization layer 36. In this application, the electrical structure 30" and the electrical structure 32" can be arranged according to the function of the circuit, for example, the electrical structures 30" and 32" can be any desired function components, for example, connections to other electrical structures.

Figure 5:
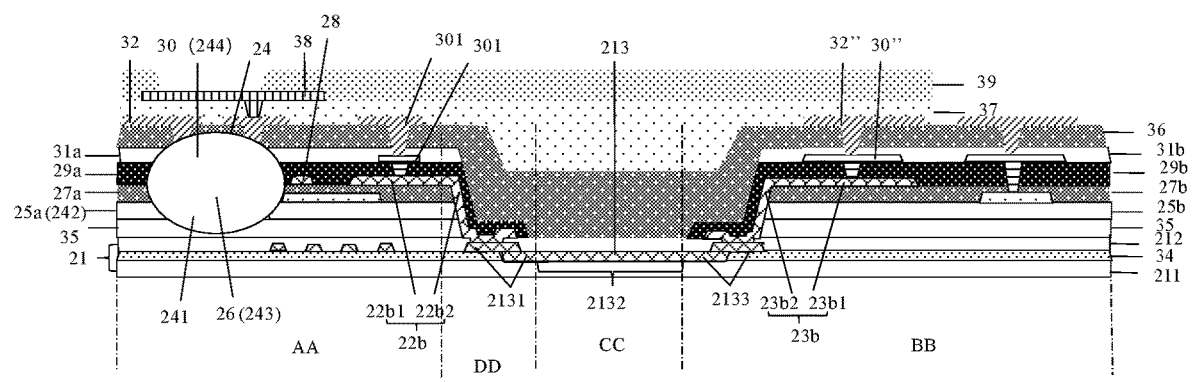
FIG. 5 illustrates a cross-sectional view of a display substrate according to an embodiment of the present disclosure.

FIG. 5 illustrates a display substrate according to an embodiment of the present disclosure, wherein the second conductive layer 28 of the display substrate includes a first electrical structure 22b and a second electrical structure 23b. As shown in FIG. 5, the second insulating layer 27 has a first side facing the flexible substrate 21, a second side facing away from the flexible substrate 21, and a third side of the first portion 27a of the second insulating layer 27 connecting the first side and the second side and adjacent to the bending area CC. The first electrical structure 22b includes a first portion 22b1 and a second portion 22b2. The first portion 22b1 may cover the second side of the first portion 27a of the second insulating layer 27. The second portion 22b2 may cover the third side of the first portion 27a of the second insulating layer 27 and contact the first portion 2131 of the wiring 213 via the first opening in the second flexible substrate 212.

As shown in FIG. 5, the second portion 27b of the second insulating layer 27 has a fourth side connecting the first and second sides of the second insulating layer 27 and adjacent to the bending area CC. The second electrical structure 23b includes a first portion 23b1 and a second portion 23b2. The first portion 23b1 may cover the second side of the second portion 27b of the second insulating layer 27. The second portion 23b2 covers the fourth side of the second portion 27b of the second insulating layer 27 and contacts the third portion 2133 of the wiring 213 via the second opening in the second flexible substrate 212.

In the example shown in FIG. 5, the third conductive layer 30 of the display substrate further includes a third electrical structure 301 located in the display area AA and an electrical structure 30" located in the bending area CC. The third electrical structure 301 of the third conductive layer 30 contacts the first portion 22b1 of the first electrical structure 22b via the opening in the first portion 29a of the third insulating layer 29. The electrical structure 30" contacts the first portion 23b1 of the second electrical structure 23b via the opening in the second portion 29b of the third insulating layer 29. In addition, the fourth conductive layer 32 of the display substrate further includes a third electrical structure 301 located in the display area AA and an electrical structure 32" located in the pad area BB. The third electrical structure 301 of the fourth conductive layer 32 contacts the third electrical structure 301 of the third conductive layer 32 via the opening in the first portion 31a of the fourth insulating layer 31 and first planarization layer 36. The electrical structure 32" contacts the electrical structure 30" via the opening in the second portion 31b of the fourth insulating layer 31 and the first planarization layer 36.

Figure 6:
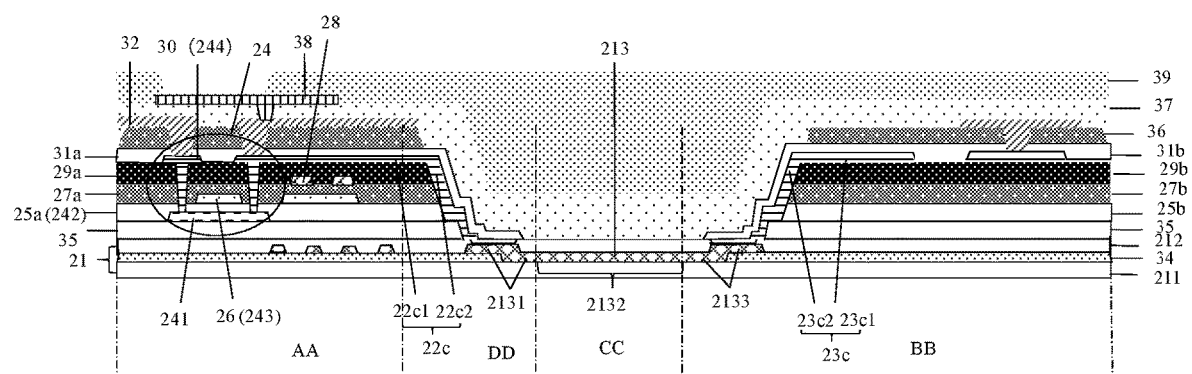
FIG. 6 illustrates a cross-sectional view of a display substrate according to an embodiment of the present disclosure.

FIG. 6 illustrates a display substrate according to an embodiment of the present disclosure, wherein the third conductive layer 30 of the display substrate has a first electrical structure 22c and a second electrical structure 23c. As shown in FIG. 6, the third insulating layer 29 has a first side facing the flexible substrate 21, a second side facing away from the flexible substrate 21, and a third side of the first portion 29a of the third insulating layer 29 connecting the first side and the second side and adjacent to the bending area CC. The first electrical structure 22c may include a first portion 22c1 and a second portion 22c2. The first portion 22c1 may cover the second side of the first portion 29a of the third insulating layer 29. The second portion 22c2 may cover the third side of the first portion 29a of the third insulating layer 29 and contact the first portion 2131 of the wiring 213 via the first opening in the second flexible substrate 212.

As shown in FIG. 6, the second portion 29b of the third insulating layer 29 has a fourth side connecting the first side and the second side of the third insulating layer 29 and adjacent to the bending area CC. The second electrical structure 23c includes a first portion 23c1 and a second portion 23c2. The first portion 23c1 may cover the second side of the second portion 29b of the third insulating layer 29. The second portion 23c2 may cover the fourth side of the second portion 29b of the third insulating layer 29 and contact the third portion 2133 of the wiring 213 via the second opening in the second flexible substrate 21.

Figure 7:
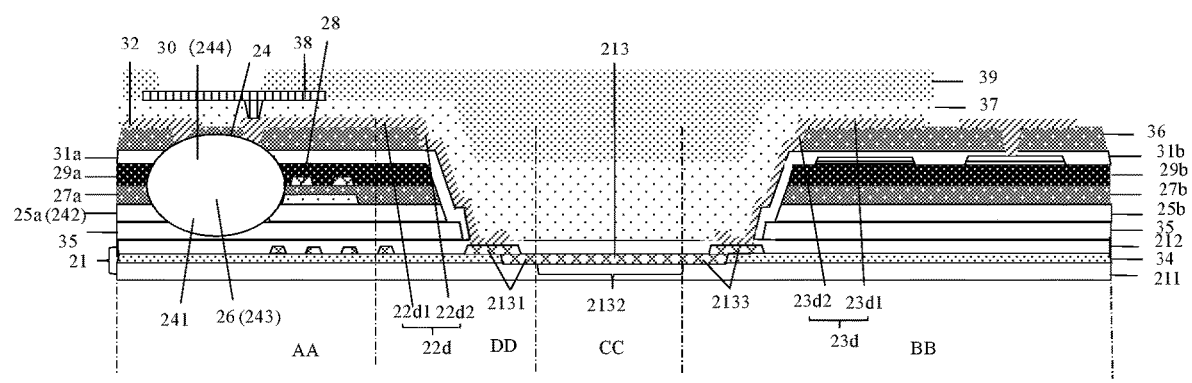
FIG. 7 illustrates a cross-sectional view of a display substrate according to an embodiment of the present disclosure.

FIG. 7 illustrates a display substrate according to an embodiment of the present disclosure, wherein the fourth conductive layer 32 of the display substrate includes a first electrical structure 22d and a second electrical structure 23d. As shown in FIG. 7, the fourth insulating layer 31 has a first side facing the flexible substrate 21, a second side facing away from the flexible substrate 21, and a third side of the first portion 31a of the fourth insulating layer 31 connecting the first side and the second side and adjacent to the bending area CC. The first electrical structure 22d includes a first portion 22d1 and a second portion 22d2. The first portion 22d1 may cover the second side of the first portion 31a of the fourth insulating layer 31. The second portion 22d2 may cover the third side of the first portion 31a of the fourth insulating layer 31 and contact the first portion 2131 of the wiring 213 via the first opening in the second flexible substrate.

As shown in FIG. 7, the second portion 31b of the fourth insulating layer 31 has a fourth side connecting the first side and the second side of the fourth insulating layer 31 and adjacent to the bending area CC. The second electrical structure 23d includes a first portion 23d1 and a second portion 23d2. The first portion 23d1 may cover the second side of the second portion 31b of the fourth insulating layer 31. The second portion 23d2 may cover the fourth side of the second portion 31b of the fourth insulating layer 31 and contact the third portion 2133 of the wiring 213 via the second opening in the second flexible substrate.

Figure 8:
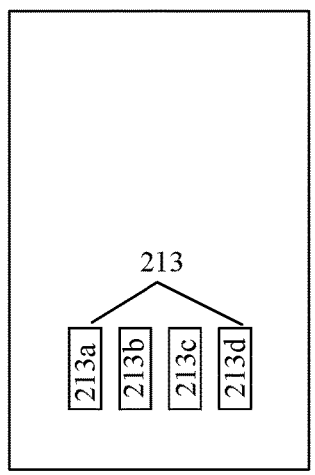
FIG. 8 illustrates a top view of a display substrate according to an embodiment of the present disclosure.

FIG. 8 shows a top view of a display substrate according to one embodiment of the present disclosure. As shown in FIG. 8, the wirings of the display substrate may include a first wiring 213a, a second wiring 213b, a third wiring 213c, and a fourth wiring 213d spaced in the x direction. The x direction is perpendicular to the direction from the display area AA to the pad area BB (ie, the y direction). In this example, the first wiring 213a is the first wiring 213 shown in FIG. 4, the second wiring 213b is the first wiring 213 shown in FIG. 5, the third wiring 213c is the first wiring 213 shown in FIG. 6, the fourth wiring 213d is the first wiring 213 shown in FIG. 7. In this example, the first electrical structure of the display substrate may include a first electrical sub-structure (for example, the first electrical structure 22a shown in FIG. 4), a second electrical sub-structure (for example, the first electrical structure 22b shown in FIG. 5), a third electrical sub-structure (for example, the first electrical structure 22c shown in FIG. 6), and a fourth electrical sub-structure (for example, the first electrical structure 22d shown in FIG. 7). In this example, the second electrical structure of the display substrate may include a fifth electrical sub-structure (for example, the second electrical structure 23a shown in FIG. 4), a sixth electrical sub-structure (for example, the second electrical structure 23b shown in FIG. 5), a seventh electrical sub-structure (for example, the second electrical structure 23c shown in FIG. 6), and an eighth electrical sub-structure (for example, the second electrical structure 23d shown in FIG. 7).

In this example, the first conductive layer of the display substrate may include the first electrical sub-structure and the fifth electrical sub-structure, the second conductive layer may include the second electrical sub-structure and the sixth electrical sub-structure, and the third conductive layer may include the third electrical sub-structure and the seventh electrical sub-structure, and the fourth conductive layer may include the fourth electrical sub-structure and the eighth electrical sub-structure.

Figure 9:
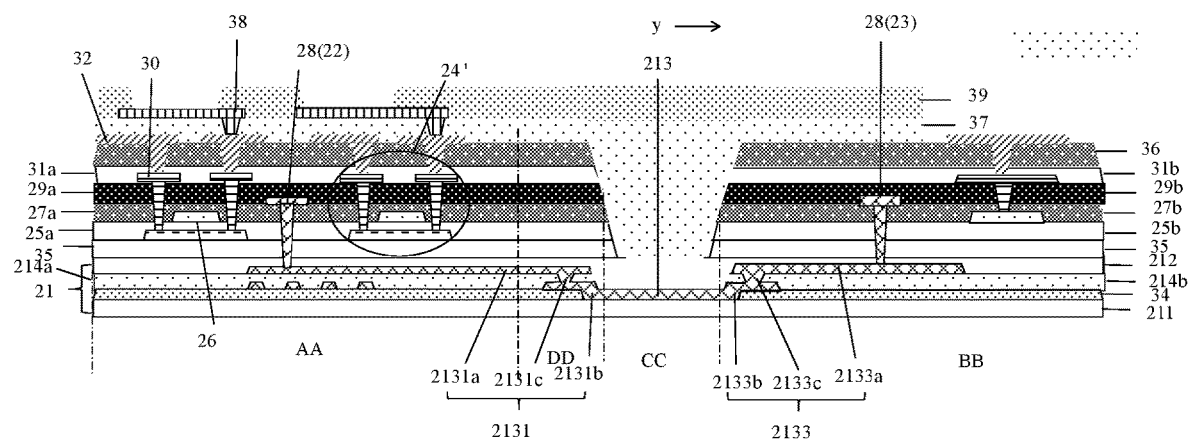
FIG. 9 illustrates a cross-sectional view of a display substrate according to an embodiment of the present disclosure.

FIG. 9 illustrates a cross-sectional view of a display substrate according to an embodiment of the present disclosure. As shown in FIG. 9, the thin film transistors of the display substrate may include an edge thin film transistors 24' closest to the bending area CC along the y-direction (i.e., the direction from the display area AA to the pad area BB). The first portion 2131 of the wiring 213 of the display substrate extends beyond the edge thin film transistor 24' and extends to the display area AA in the opposite direction of the y-direction. As shown in FIG. 9, the flexible substrate 21 further includes an insulating layer 214 between the first flexible substrate 211 and the second flexible substrate 212. The insulating layer 214 includes a first portion 214a in the display area AA and the wiring area DD and a second portion 214b in the pad area BB.

In an embodiment of the present disclosure, at least a portion of the first portion 2131 of the wiring 213 may be located between the first portion 214a of the insulating layer 214 and the second flexible substrate 212, and at least a portion of the third portion 2133 of the wiring 213 may be located between the second portion 214b of the insulating layer 214 and the second flexible substrate 212.

In the example shown in FIG. 9, the first portion 2131 of the wiring 213 may include a first sub-portion 2131 located between the first portion 214a of the insulating layer 214 and the second flexible substrate 212, a second sub-portion 2131b located between the first portion 214a of the insulating layer 214 and the first flexible substrate 211, and a third sub-portion 2131c connecting the first sub-portion 2131a and the second sub-portion 2131b. As shown in FIG. 9, the third sub-portion 2131c may connect the first sub-portion 2131a and the second sub-portion 2131b via holes in the first portion 214a of the insulating layer 214. The third portion 2133 of the wiring 213 may include a first sub-portion 2133a between the second portion 214b of the insulating layer 214 and the second flexible substrate 212, a second sub-portion 2133b between the second portion 214b of the insulating layer 214 and the first flexible substrate 211, and a third sub-portion 2133c connecting the first sub-portion 2133a and the second sub-portion 2133b. As shown in FIG. 9, the third sub-portion 2133c may connect the first sub-portion 2133a and the second sub-portion 2133b via holes in the second portion 214b of the insulating layer 214.

As shown in FIG. 9, the second conductive layer 28 of the display substrate may include the first electrical structure 22 shown in FIG. 2. The first electrical structure 22 is located in the display area AA. The first electrical structure 22 is connected to the first sub-portion 2131a of the first portion 2131 of the wiring 213 via holes through the first portion 27a of the second insulating layer, the first portion 25a of the first insulating layer, the second barrier layer 35 and the second flexible substrate 212. The second conductive layer 28 is also located on the second insulating layer 27b in the pad area BB. The second conductive layer 28 may include the second electrical structure 23 shown in FIG. 2, and the second electrical structure 23 is connected to the first sub-portion 2133a of the third portion 2133 of the wiring 213 via holes through the second portion 27b of the second insulating layer, the second portion 25b of the first insulating layer, the second barrier layer 35 and the second flexible substrate 212. It should be noted that, other film layers or structures of the display substrate shown in FIG. 9 are the same as those of the display substrate shown in FIG. 3, and the description is not repeated here. In addition, the first electrical structure 22 shown in FIG. 9 may also be located between the edge thin film transistor 24' and the wiring area DD.

Figure 10:
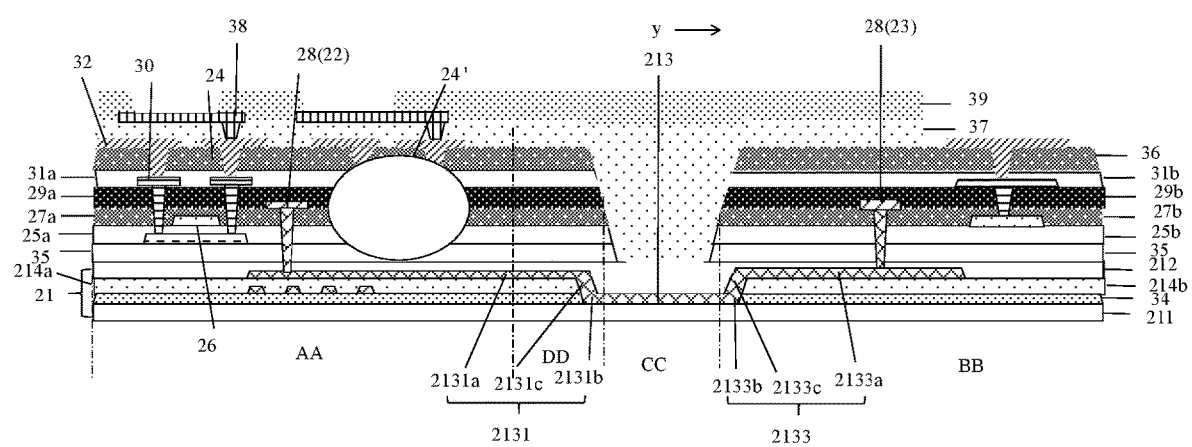
FIG. 10 illustrates a cross-sectional view of a display substrate according to an embodiment of the present disclosure.

FIG. 10 illustrates a cross-sectional view of a display substrate according to an embodiment of the present disclosure. As shown in FIG. 10, the insulating layer 214 has a first side facing the flexible substrate 21, a second side facing away from the flexible substrate 21, and a third side of the first portion 214a of the insulating layer 214 connecting the first side and the second side and adjacent to the bending area CC. The third sub-portion 2131c of the first portion 2131 of the wiring 213 of the display substrate may cover the third side of the first portion 214a of the insulating layer 214 to connect the first sub-portion 2131a and the second sub-portion 2131b. The second portion 214b of the insulating layer 214 has a fourth side connecting the first side and the second side of the insulating layer 214 and adjacent to the bend area CC. The third sub-portion 2133c of the third portion 2133 of the wiring 213 may cover the fourth side of the second portion 214b of the insulating layer 214 to connect the first sub-portion 2133a and the second sub-portion 2133b. It should be noted that, other film layers or structures of the display substrate shown in FIG. 10 are the same as those of the display substrate shown in FIG. 9, and the description is not repeated here.

Although FIGS. 4-7 and FIGS. 9-10 of the present application takes the substrate simultaneously including the first insulating layer, the first conductive layer, the second insulating layer, the second conductive layer, the third insulating layer, the third conductive layer, and the fourth insulating layer and the fourth conductive layer as an example for description, and it can be understood that these film layers can be increased or decreased according to actual needs. In addition, the first electrical structure and the second electrical structure may be simultaneously provided in the corresponding conductive layers as required.

In yet another aspect of the present disclosure, there is also provided a display apparatus including the display substrate described in the foregoing embodiments. By the configuration in which wirings passing through the display area, the bending area, and the pad area in this order are disposed between the first flexible substrate and the second flexible substrate, various wirings located in the peripheral area around the display area can be jumped to this wiring, which can thereby reduce the width of the peripheral area. In addition, in the bending area, since the wiring is disposed between the first flexible substrate and the second flexible substrate, the wiring is located at the neutral layer of the overall substrate composed of the first flexible substrate and the second flexible substrate, so that no additional use of UV glue is required, so that an increase in the width of the frame caused by the UV glue can be avoided.

The foregoing description of the embodiment has been provided for purpose of illustration and description. It is not intended to be exhaustive or to limit the present application. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the present application, and all such modifications are comprised within the scope of the present application.

What is claimed is:

1. A display substrate, comprising:
   a flexible substrate having a display area and a peripheral area located on at least one side of the display area, wherein the peripheral area sequentially comprises a wiring area, a bending area and a pad area along a direction away from the display area;
   a first electrical structure located on a side of the bending area of the flexible substrate away from the pad area;
   a second electrical structure located in the pad area;
   wherein the flexible substrate comprises:
      a first flexible substrate;
      a second flexible substrate located on the first flexible substrate; and
      a wiring located between the first flexible substrate and the second flexible substrate, wherein the wiring has a first portion located in the wiring area, a second portion located in the bending area, and a third portion located in the pad area,
   wherein the first electrical structure is connected to the first portion of the wiring and the second electrical structure is connected to the third portion of the wiring,
   wherein the first portion of the wiring extends to the display area in a direction from the pad area to the display area, the flexible substrate further comprises an insulating layer between the first flexible substrate and the second flexible substrate,
   wherein the insulating layer comprises a first portion in the display area and the wiring area and a second portion in the pad area, at least a part of the first portion of the wiring is located between the first portion of the insulating layer and the second flexible substrate, at least a part of the third portion of the wiring is located between the second portion of the insulating layer and the second flexible substrate.

2. The display substrate of claim 1, further comprising:
   a thin film transistor located in the display area, the thin film transistor comprising an active layer on the flexible substrate, a gate insulating layer on the active layer, and a gate electrode located on the gate insulating layer, wherein the gate insulating layer is a part of a first insulating layer covering the flexible substrate, the first insulating layer has a first portion located in the display area and the wiring area, and the gate electrode is a part of a first conductive layer located on the first insulating layer;
   wherein the first conductive layer comprises the first electrical structure.

3. The display substrate of claim 2, wherein the first insulating layer has a first side facing the flexible substrate, a second side facing away from the flexible substrate, and a third side of a first portion of the first insulating layer connecting the first side and the second side and adjacent to the bending area, the first electrical structure further comprises a first portion covering the second side of the first portion of the first insulating layer and a second portion covering the third side, wherein the first electrical structure contacts the first portion of the wiring via a first opening of the second flexible substrate.

4. The display substrate of claim 1, further comprising:
   a thin film transistor located in the display area, the thin film transistor comprising an active layer located on the flexible substrate, a gate insulating layer located on the active layer, and a gate electrode on the gate insulating layer, wherein the gate insulating layer is a part of a first insulating layer covering the flexible substrate, the first insulating layer has a first portion located in the display area and the wiring area, and the gate electrode is a part of the first conductive layer located on the first insulating layer;
   a second insulating layer, comprising a first portion located on the first conductive layer and on the first portion of the first insulating layer in the display area and the wiring area;

a second conductive layer located on the second insulating layer;

wherein at least one of the first conductive layer and the second conductive layer comprises the first electrical structure.

5. The display substrate of claim 4, wherein the second conductive layer comprises the first electrical structure, and the second insulating layer has a first side facing the flexible substrate, a second side facing away from the flexible substrate, and a third side of a first portion of the second insulating layer connecting the first side and the second side and adjacent to the bending area, the first electrical structure further comprises a first portion covering the second side of the first portion of the second insulating layer and a second portion covering the third side, wherein the first electrical structure contacts the first portion of the wiring via a first opening of the second flexible substrate.

6. The display substrate of claim 1, further comprising:
a thin film transistor located in the display area, the thin film transistor comprising an active layer located on the flexible substrate, a gate insulating layer located on the active layer, and a gate electrode located on the gate insulating layer, wherein the gate insulating layer is a part of a first insulating layer covering the flexible substrate, the first insulating layer has a first portion located in the display area and the wiring area, and the gate electrode is a part of the first conductive layer located on the first insulating layer;
a second insulating layer, comprising a first portion located on the first conductive layer and on the first portion of the first insulating layer in the display area and the wiring area;
a second conductive layer located on the second insulating layer;
a third insulating layer, comprising a first portion located on the second conductive layer and on a first portion of the second insulating layer in the display area and the wiring area;
a third conductive layer located on the third insulating layer, wherein the third conductive layer comprises a source/drain electrode of the thin film transistor, and the source/drain electrode is connected to a source/drain region of the active layer of the thin film transistor via a hole passing through the first insulating layer, the second insulating layer and the third insulating layer;
wherein at least one of the first conductive layer, the second conductive layer and the third conductive layer comprises the first electrical structure.

7. The display substrate of claim 6, wherein the third conductive layer comprises the first electrical structure, and the third insulating layer has a first side facing the flexible substrate, a second side facing away from the flexible substrate, and a third side of a first portion of the third insulating layer connecting the first side and the second side and adjacent to the bending area, the first electrical structure further comprises a first portion covering the second side of the first portion of the third insulating layer and a second portion covering the third side, wherein the first electrical structure contacts the first portion of the wiring via a first opening of the second flexible substrate.

8. The display substrate of claim 1, further comprising:
a thin film transistor located in the display area, the thin film transistor comprising an active layer located on the flexible substrate, a gate insulating layer located on the active layer, and a gate electrode located on the gate insulating layer, wherein the gate insulating layer is a part of a first insulating layer covering the flexible substrate, the first insulating layer has a first portion located in the display area and the wiring area, and the gate electrode is a part of the first conductive layer located on the first insulating layer;
a second insulating layer, comprising a first portion located on the first conductive layer and on the first portion of the first insulating layer in the display area and the wiring area;
a second conductive layer located on the second insulating layer;
a third insulating layer, comprising a first portion located on the second conductive layer and on a first portion of the second insulating layer in the display area and the wiring area;
a third conductive layer located on the third insulating layer, wherein the third conductive layer comprises a source/drain electrode of the thin film transistor, and the source/drain electrode is connected to a source/drain region of the active layer of the thin film transistor via a hole passing through the first insulating layer, the second insulating layer and the third insulating layer;
a fourth insulating layer comprising a first portion on the first portion of the third insulating layer in the display area and the wiring area; and
a fourth conductive layer located on the fourth insulating layer;
wherein at least one of the first conductive layer, the second conductive layer, the third conductive layer and the fourth conductive layer comprises the first electrical structure.

9. The display substrate of claim 8, wherein the fourth conductive layer comprises the first electrical structure, and the fourth insulating layer has a first side facing the flexible substrate, a second side facing away from the flexible substrate, and a third side of a first portion of the fourth insulating layer connecting the first side and the second side and adjacent to the bending area, the first electrical structure further comprises a first portion covering the second side of the first portion of the fourth insulating layer and a second portion covering the third side, wherein the first electrical structure contacts the first portion of the wiring via a first opening of the second flexible substrate.

10. The display substrate of claim 8, wherein the first conductive layer comprises the first electrical structure, the display substrate further comprises a third electrical structure on the third insulating layer, the third electrical structure is connected to the first electrical structure via a hole passing through the third insulating layer.

11. The display substrate of claim 8, wherein the second conductive layer comprises the first electrical structure, the display substrate further comprises a third electrical structure on the third insulating layer, the third electrical structure is connected to the first electrical structure via a hole passing through the third insulating layer.

12. The display substrate of claim 10, wherein at least one of the third conductive layer and the fourth conductive layer comprises the third electrical structure.

13. The display substrate of claim 8, wherein,
the first insulating layer further comprises a second portion located in the pad area,
the second insulating layer further comprises a second portion located on the second portion of the first insulating layer in the pad area;
the third insulating layer further comprises a second portion located on the second portion of the second insulating layer in the pad area;

the fourth insulating layer further comprises a second portion located on the second portion of the third insulating layer in the pad area; and wherein, at least one of the first conductive layer, the second conductive layer, the third conductive layer and the fourth conductive layer further comprises a second electrical structure, and the second electrical structure is connected to the third portion of the wiring via a second opening of the second flexible substrate.

14. The display substrate of claim 8, wherein the wiring comprise a first wiring, a second wiring, a third wiring and a fourth wiring spaced apart in a direction perpendicular to a direction from the display area to the pad area, the first electrical structure comprises a first electrical sub-structure, a second electrical sub-structure, a third electrical sub-structure and a fourth electrical sub-structure, the second electrical structure comprises a fifth electrical sub-structure, a six electrical sub-structure, a seventh electrical sub-structure and a eighth electrical sub-structure;

wherein the first conductive layer comprises the first electrical sub-structure and the fifth electrical sub-structure; the second conductive layer comprises the second electrical sub-structure and the sixth electrical sub-structure; the third conductive layer comprises the third electrical sub-structure and the seventh electrical sub-structure; and the fourth conductive layer comprises the fourth electrical sub-structure and the eighth electrical sub-structure.

15. The display substrate of claim 1, wherein the first portion of the wiring comprises a first sub-portion located between the first portion of the insulating layer and the second flexible substrate, a second sub-portion located between the first portion of the insulating layer and the first flexible substrate, and a third sub-portion connecting the first sub-portion and the second sub-portion, wherein the third portion of the wiring comprises a first sub-portion located between the second portion of the insulating layer and the second flexible substrate, a second sub-portion located between the second portion of the insulating layer and the first flexible substrate, and a third sub-portion connecting the first sub-portion and the second sub-portion.

16. The display substrate of claim 1, the second conductive layer comprising the first electrical structure, the first electrical structure is connected to the first portion of the wiring via a hole passing through the first insulating layer, the second insulating layer and the second flexible substrate.

17. A display apparatus comprising the display substrate according to claim 1.

18. The display substrate of claim 11, wherein at least one of the third conductive layer and the fourth conductive layer comprises the third electrical structure.

19. A display apparatus comprising the display substrate according to claim 2.

* * * * *